United States Patent
Nonoyama (10) Patent No.: US 9,594,120 B2
(45) Date of Patent: Mar. 14, 2017

(54) BATTERY MONITORING APPARATUS AND WIRELESS FIELD DEVICE

(71) Applicant: YOKOGAWA ELECTRIC CORPORATION, Musashino-shi, Tokyo (JP)

(72) Inventor: Atsushi Nonoyama, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 936 days.

(21) Appl. No.: 13/870,179

(22) Filed: Apr. 25, 2013

(65) Prior Publication Data

US 2013/0289908 A1 Oct. 31, 2013

(30) Foreign Application Priority Data

Apr. 25, 2012 (JP) ................. 2012-099626

(51) Int. Cl.
H02J 7/00 (2006.01)
G01R 31/36 (2006.01)

(52) U.S. Cl.
CPC ....... G01R 31/362 (2013.01); G01R 31/3662 (2013.01)

(58) Field of Classification Search
USPC .................................. 702/63; 320/136, 164
See application file for complete search history.

(56) References Cited

U.S. PATENT DOCUMENTS

| 5,365,453 | A | * | 11/1994 | Startup | ............. | G01R 31/3648 320/136 |
|---|---|---|---|---|---|---|
| 2003/0030414 | A1 | | 2/2003 | Suzuki | | |
| 2006/0068803 | A1 | | 3/2006 | Kajimoto | | |

FOREIGN PATENT DOCUMENTS

| JP | 63-214279 A | 9/1988 |
|---|---|---|
| JP | 4-132979 A | 5/1992 |
| JP | 7-79534 A | 3/1995 |
| JP | 9-230010 A | 9/1997 |

(Continued)

OTHER PUBLICATIONS

Office Action, dated for Mar. 12, 2014, issued by the Japanese Patent Office in counterpart Japanese Application No. 2012-099626.

(Continued)

*Primary Examiner* — Lam Nguyen
(74) *Attorney, Agent, or Firm* — Sughrue Mion, PLLC (57) ABSTRACT

A battery monitoring apparatus is built in a device having a primary battery. The battery monitoring apparatus includes a voltage measuring module configured to obtain an open circuit voltage of the primary battery and an output voltage of the primary battery at the time when a load current flows, a current measuring module configured to obtain the load current, a first resistance value calculating module configured to obtain a first internal resistance of the primary battery based on the open circuit voltage, the load current and the output voltage, a second resistance value calculating module configured to obtain a second internal resistance of the primary battery at which the device can operate normally based on the open circuit voltage, the load current and the minimum drive voltage, and an alarm outputting module configured to output a battery life alarm when the first internal resistance is larger than the second internal resistance.

6 Claims, 8 Drawing Sheets

(56) References Cited

FOREIGN PATENT DOCUMENTS

| JP | 11-338585 A | 12/1999 |
| JP | 2003-57321 A | 2/2003 |
| JP | 2009-214766 A | 9/2009 |
| JP | 2012-26778 A | 2/2012 |

OTHER PUBLICATIONS

Notice of Reexamination dated Dec. 12, 2016, issued by the State Intellectual Property Office of P.R. China in counterpart Chinese Application No. 201310148430.3.
Zhimin Zhou, et al., "Common Knowledge Evidence: Practical Technology of Valve Regulated Sealed Lead Acid Battery", China Electric Power Press, Oct. 2004, Total 3 pages.

\* cited by examiner

BATTERY MONITORING APPARATUS AND WIRELESS FIELD DEVICE

CROSS-REFERENCE TO RELATED APPLICATION(S)

The present application claims the benefit of priority of Japanese Patent Application No. 2012-099626, filed on Apr. 25, 2012. The disclosures of the application are incorporated herein by reference.

BACKGROUND

Technical Field

The present disclosure relates to a battery monitoring apparatus and a wireless field device having the battery monitoring apparatus, more particularly, to a battery monitoring apparatus suitable for assessing the life of a battery in an electronic device driven by a primary battery.

Related Art

Recent process control systems are sometimes configured using wireless field devices serving as a kind of wireless communication apparatus. As a driving power source for these wireless field devices, a primary battery (hereafter sometimes simply referred to as a battery) is used which is typified by, for example, a thionyl chloride lithium ion battery featuring low self discharge and being capable of supplying a nearly flat, stable and high output voltage (3.6 V) for a long time.

Process control systems for electricity, gas, and water supply and sewerage, for example, are desired to operate continuously for a long time without stopping except for periodic maintenance/inspection periods. For this reason, a sudden operation stop of a wireless field device due to reaching the life of a drive battery must be prevented from occurring as much as possible.

Although the primary battery being used as the driving power source of the wireless field device can supply a stable output voltage for a relatively long time, the consumption current of the battery differs significantly depending on the operating conditions of the wireless field device individually set by the user, whereby it is difficult to manage the life of the battery in a single uniform way.

Figure 6:
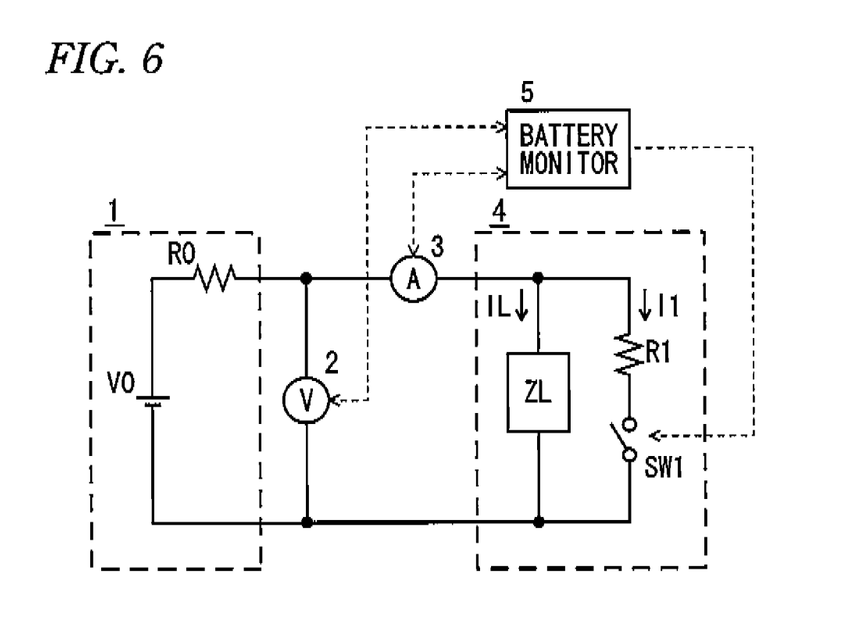
FIG. 6 is a block diagram of an electronic device having a related-art battery monitoring apparatus.

Hence, in a related-art wireless field device as an electronic device, for example, a battery monitoring apparatus (battery monitor 5) having such a circuit configuration as shown in FIG. 6 is built therein. In FIG. 6, a primary battery 1 delivering an output voltage V0 is connected in parallel with a voltage measurement section 2 via an internal resistance R0 being connected in series, and one terminal of a current measurement section 3 is connected to one terminal of the voltage measurement section 2.

A load circuit 4 is connected to the other terminal of the current measurement section 3 and to the other terminal of the voltage measurement section 2. The load circuit 4 includes a load ZL and a series circuit of a resistor R1 and a switch SW1 connected across both the terminals of the load ZL.

Figure 7:
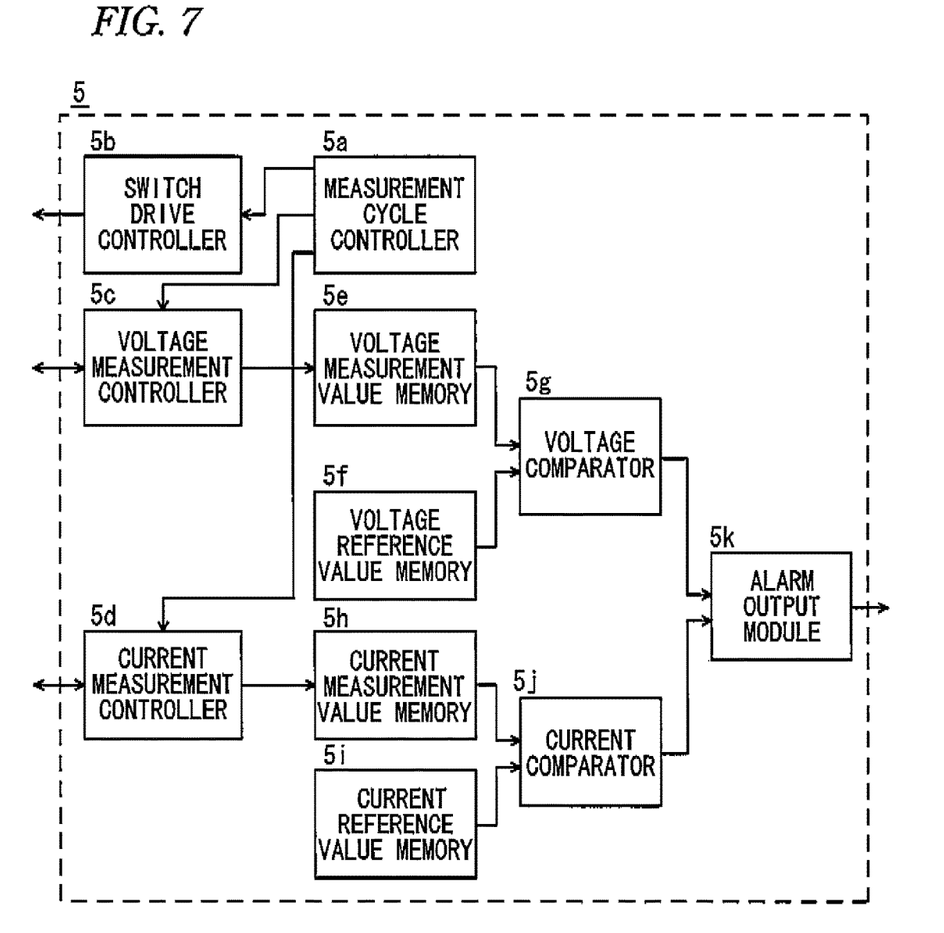
FIG. 7 is a specific function block diagram of a battery monitor 5 of FIG. 6.
Figure 8:
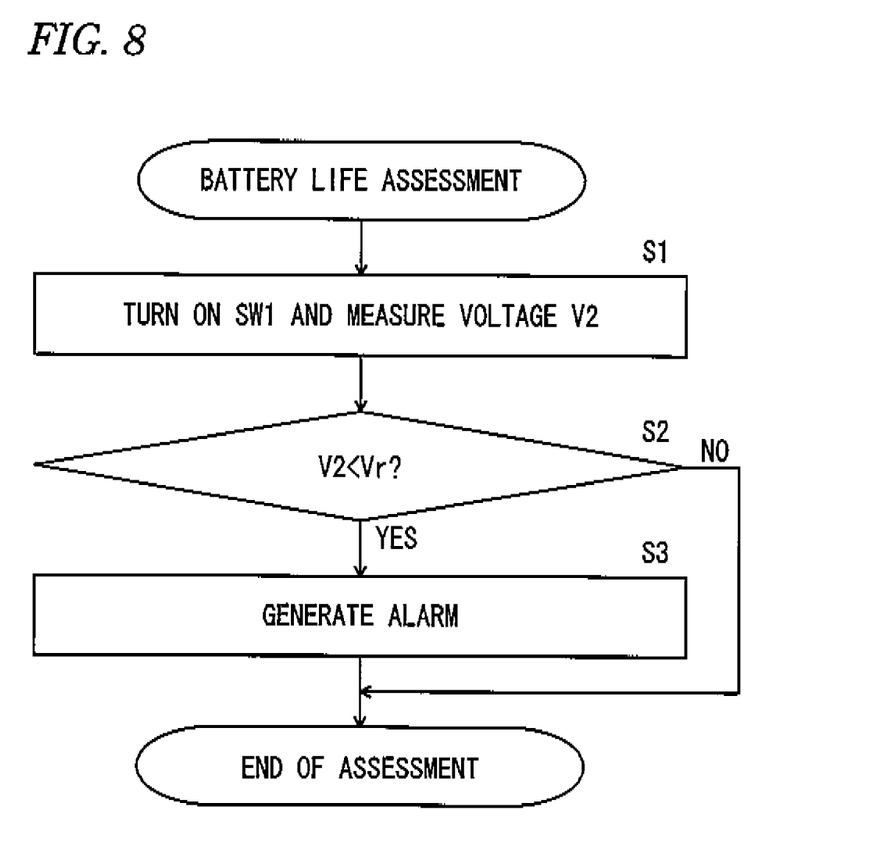
FIG. 8 is a flowchart showing the flow of a process for assessing the life of a battery 1 on the basis of the output voltage in circuits shown in FIGS. 6 and 7.

The battery monitor 5, having such function blocks as shown in FIG. 7, turns on/off the switch SW1 of the load circuit 4 depending on the cycle of measurement, controls the measurement operations of the voltage measurement section 2 and the current measurement section 3, obtains the measurement data of the respective measurement sections, and executes such a battery life assessment process as shown in FIG. 8.

In FIG. 7, a measurement cycle controller 5a, being used to control the measurement cycle of the entire circuit, outputs predetermined timing clocks to a switch drive controller 5b for turning on/off the switch SW1, to a voltage measurement controller 5c for controlling the voltage measurement operation of the voltage measurement section 2, and to a current measurement controller 5d for controlling the current measurement operation of the current measurement section 3, so as to obtain voltage and current measurement data, for example, once per hour, the timing clocks being synchronous with one another.

The voltage measurement data V2 of the voltage measurement section 2 in the ON state of the switch SW1 is stored in a voltage measurement value memory 5e via the voltage measurement controller 5c. Similarly, the current measurement data I2 of the current measurement section 3 in the ON state of the switch SW1 is also stored in a current measurement value memory 5h via the current measurement controller 5d as necessary.

When the switch SW1 is turned on, a certain level of load current I1 flows from the battery 1 to the series circuit of the resistor R1 and the switch SW1. The life of the battery 1 can be detected promptly by measuring the voltage in the circuit.

The voltage measurement data V2 stored in the voltage measurement value memory 5e is input to one input terminal of a voltage comparator 5g, and the voltage reference data Vr stored in a voltage reference value memory 5f is input to the other input terminal of the voltage comparator 5g.

The initial open circuit voltage of the battery 1, the previous measurement voltage or the like is used as the reference voltage Vr that is used for comparison. The necessity of generating an alarm is judged depending on how much voltage drop occurred from the reference voltage Vr.

The current measurement data I2 stored in the current measurement value memory 5h is input to one input terminal of a current comparator 5j, and the current reference data Ir stored in a current reference value memory 5i is input to the other input terminal of the current comparator 5j.

The voltage comparator 5g compares the voltage measurement data V2 read from the voltage measurement value memory 5e with the voltage reference data Vr read from the voltage reference value memory 5f. If the voltage measurement data V2 is lower than the voltage reference data Vr (V2<Vr), the voltage comparator 5g instructs an alarm output module 5k to output a predetermined alarm.

The current comparator 5j also compares the current measurement data I2 read from the current measurement value memory 5h with the current reference data Ir read from the current reference value memory 5i. If the current measurement data I2 read from the current measurement value memory 5h is lower than the current reference data Ir read from the current reference value memory 5i (I2<Ir), the current comparator 5j instructs the alarm output module 5k to output a predetermined alarm.

FIG. 8 is a flowchart showing the flow of a process for assessing the life of the battery 1 on the basis of the output voltage in the circuits shown in FIGS. 6 and 7. The switch SW1 is turned on and the output voltage V2 of the primary battery 1 is measured by the voltage measurement section 2 (at step S1), and the output voltage is stored in the voltage measurement value memory 5e.

The voltage comparator 5g compares the voltage measurement data V2 with the voltage reference data Vr and judges whether V2<Vr is established (at step S2).

In the case that V2<Vr is established, the voltage comparator 5g instructs the alarm output module 5k to output a predetermined alarm, such as sound, light, electronic mail, etc. for externally notifying that the output voltage of the battery 1 has dropped, whereby the alarm output module 5k outputs the predetermined alarm (at step S3).

On the other hand, in the case that V2<Vr is not established, a sufficient output voltage is obtained. Hence, no alarm is output and the life assessment process is ended.

Patent Document 1 discloses a technology in which the charging state of a nickel-cadmium battery or a nickel-hydrogen battery is detected without using a temperature sensor and the completion of charging is detected accurately.

Patent Document 2 discloses a technology in which the voltage value of a battery during discharge is calculated using the internal resistance value of the battery and the reference resistance value of a load, whereby errors in the calculation values of SOH and SOC are reduced and the state of the battery can be estimated properly.

PRIOR ART DOCUMENT

Patent Document

[Patent Document 1] JP-A-7-79534
[Patent Document 2] JP-A-2009-214766

The open circuit voltage of the battery 1, however, has an individual difference and changes depending on the history of load current and temperature.

In the related-art circuit configuration and method shown in FIGS. 6 to 8, the output voltage of the battery 1 is measured while the switch SW1 is turned on and a certain level of load current is allowed to flow. However, the change in voltage at no load is not taken into consideration.

Hence, it is impossible to judge whether the change in the output voltage from the previous measurement state is caused due to the life of the battery 1, due to the change in temperature unrelated to the life of the battery 1 or due to factors, such as changes with time, unrelated to the life.

More specifically, in the related-art circuit configuration and method, there is a possibility that an alarm is generated when the output voltage of the battery 1 has just changed with time, regardless of the life of the battery 1.

Furthermore, when the life of the battery 1 approaches its end, the internal resistance of the battery 1 sometimes increases. At this time, if the reference voltage Vr is lowered excessively to avoid a false alarm from being generated, there is a danger that no alarm is generated even in the case that the change in the output voltage of the battery 1 due to the change in the load current has increased and the circuit cannot operate normally.

SUMMARY

Exemplary embodiments of the invention provide a battery monitoring apparatus and a wireless field device having the battery monitoring apparatus, which can generate a battery life alarm accurately in an operable state of a device.

A battery monitoring apparatus to be built in a device in which a primary battery is used as a driving power source, according to an exemplary embodiment of the invention, comprises:

a voltage measuring module configured to obtain an open circuit voltage of the primary battery and an output voltage of the primary battery at the time when a load current flows;

a current measuring module configured to obtain the load current of the primary battery;

a first resistance value calculating module configured to obtain a first internal resistance of the primary battery on the basis of the open circuit voltage, the load current and the output voltage;

a second resistance value calculating module configured to obtain a second internal resistance of the primary battery at which the device can operate normally on the basis of the open circuit voltage, the load current and a minimum drive voltage inherent in the device; and an alarm outputting module configured to output a battery life alarm when the first internal resistance is larger than the second internal resistance.

The first internal resistance may be obtained by the following equation:

$$R0=(V1-V2)/I1,$$

wherein V1 is the open circuit voltage, I1 is the load current, V2 is the output voltage and R0 is the first internal resistance.

The second internal resistance may be obtained by the following equation:

$$Rno=(V1-Vmin)/I1$$

wherein V1 is the open circuit voltage, I1 is the load current, Vmin is the minimum drive voltage and Rno is the second internal resistance.

The device may be a wireless field device of a process control system.

The second resistance value calculating module may obtain the corresponding second internal resistance based on the open circuit voltage, by referring to a correspondence table of the open circuit voltage of the primary battery and the second internal resistance of the primary battery on the basis of a simulation performed in consideration of wireless communication of the device.

Consequently, a battery life alarm can be generated accurately in an operable state of a device.

DETAILED DESCRIPTION

Figure 1:
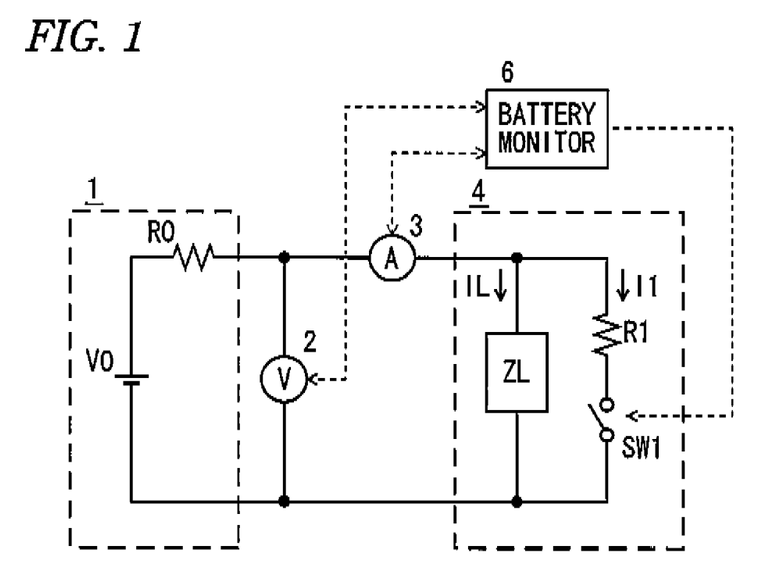
FIG. 1 is a block diagram showing an electronic device having a battery monitoring apparatus according to an embodiment of the present invention.

An embodiment according to the present invention will be described below in detail using the drawings. FIG. 1 is a block diagram showing a wireless field device having a battery monitor 6 according to an embodiment of the present invention, and the components common to those shown in FIG. 6 are designated by the same numerals and signs. FIG. 1 differs from FIG. 6 in the specific configuration of a battery monitor 6.

Figure 2:
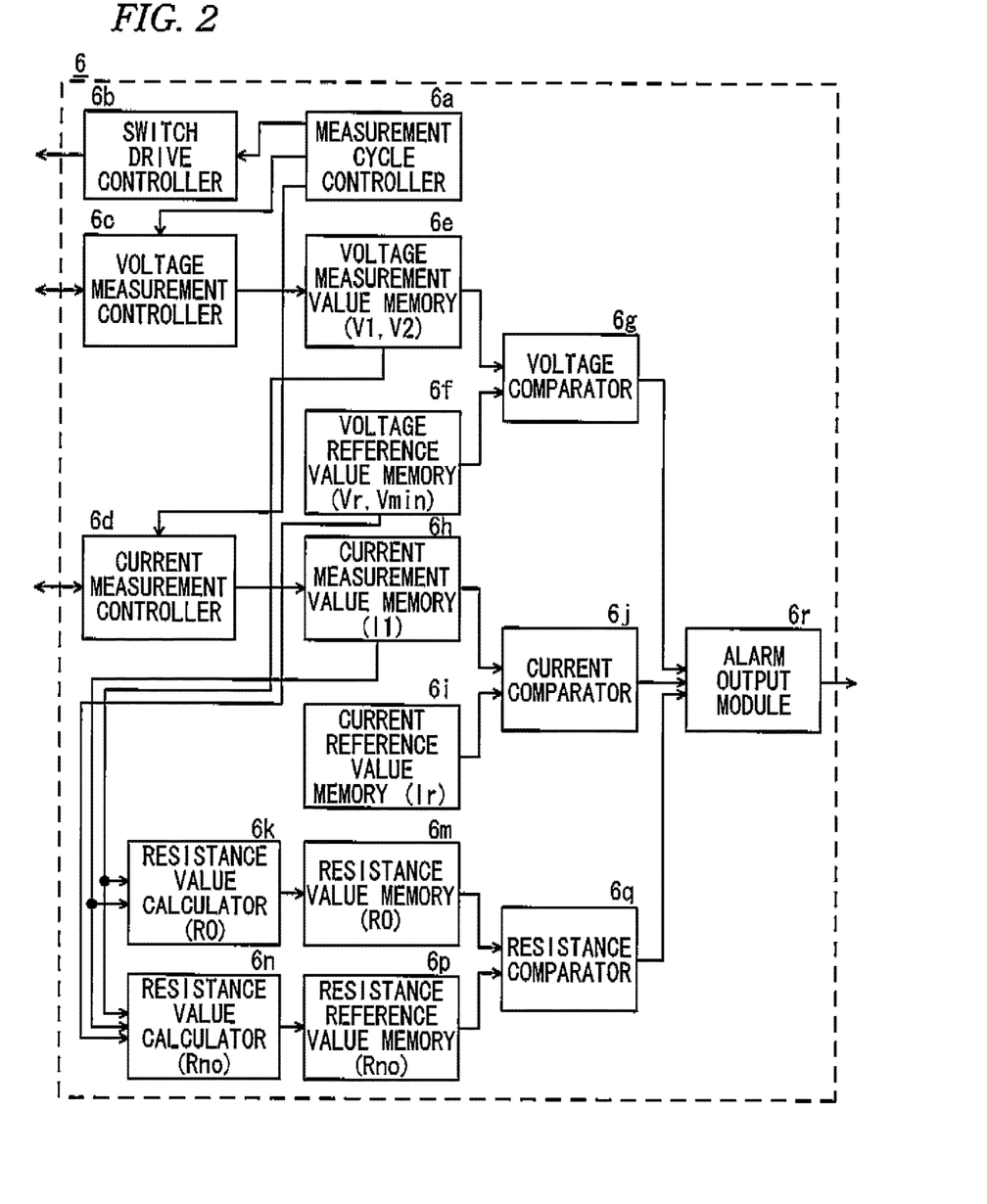
FIG. 2 is a specific function block diagram of a battery monitor 6 of FIG. 1.

FIG. 2 is a specific function block diagram of the battery monitor 6, and the components common to those shown in the function block diagram of FIG. 7 are indicated by the same subscripts a to j. FIG. 2 differs from FIG. 7 in that the battery monitor 6 shown in the function block diagram of FIG. 2 is provided with a resistance value calculator 6k for calculating the internal resistance R0 of the battery 1, a resistance value memory 6m for storing the value of the calculated internal resistance R0, a resistance value calculator 6n for calculating the internal resistance Rno of the battery 1 at which an device can operate normally, a resistance reference value memory 6p for storing the calculated internal resistance Rno, and a resistance comparator 6q for comparing the internal resistance R0 with the internal resistance Rno.

In FIG. 2, the resistance value calculator 6k calculates the internal resistance R0 (=(V1−V2)/I1) of the battery 1 on the basis of the open circuit voltage V1 of the battery 1 at the time when the switch SW1 is OFF (in reality, the voltage at the time when a current IL flows in the load circuit ZL), the output voltage V2 of the battery 1 at the time when the switch SW1 is turned on and then a certain level of load current I1 flows from the battery 1 to the series circuit of the resistor R1 and the switch SW1, and the load current I1 obtained from the measurement value of the current measurement section 3. The resistance value calculator 6k then stores the resistance value of the calculated internal resistance R0 to the resistance value memory 6m sequentially.

The resistance value calculator 6n calculates the internal resistance Rno (=(V1−Vmin)/I1) of the battery 1 on the basis of the open circuit voltage V1 of the battery 1 at the time when the switch SW1 is OFF (in reality, the voltage at the time when the current IL flows in the load circuit ZL), a minimum drive voltage Vmin (for example, 3 V) stored in a voltage reference value memory 6f and required for normal operation of the device, and the load current I1 obtained from the measurement value of the current measurement section 3. The resistance value calculator 6n then stores the resistance value of the calculated internal resistance Rno to the resistance reference value memory 6p sequentially. Although the load current I1 is obtained from the measurement value of the current measurement section 3, the load current I1 can also be calculated on the basis of the output voltage V2 and the resistance value of the resistor R1.

The resistance comparator 6q compares the internal resistance R0 read from the resistance value memory 6m with the internal resistance Rno read from the resistance reference value memory 6p. In the case that the internal resistance R0 read from the resistance value memory 6m is larger than the internal resistance Rno read from the resistance reference value memory 6p (R0>Rno), the resistance comparator 6q instructs an alarm output module 6r to output a predetermined alarm.

If the internal resistance R0 of the battery 1 becomes too large, the output voltage of the battery 1 lowers due to the load current IL of the device and the device cannot maintain its normal operation. In other words, it is assumed that this state is the state in which the life of the battery 1 is ended.

Hence, as described above, the internal resistance Rno of the battery 1 at which the device can operate normally is obtained by performing calculation on the basis of the minimum drive voltage (for example, 3 V) required for normal operation of the device, the open circuit voltage V1 of the battery 1 and the load current I1, and a judgment is made as to whether the above-mentioned internal resistance R0 is larger or smaller than the internal resistance Rno, and then a decision is made so that an alarm is generated in the case of R0>Rno, whereby the alarm can be generated securely before the device becomes incapable of operating normally.

Figure 3:
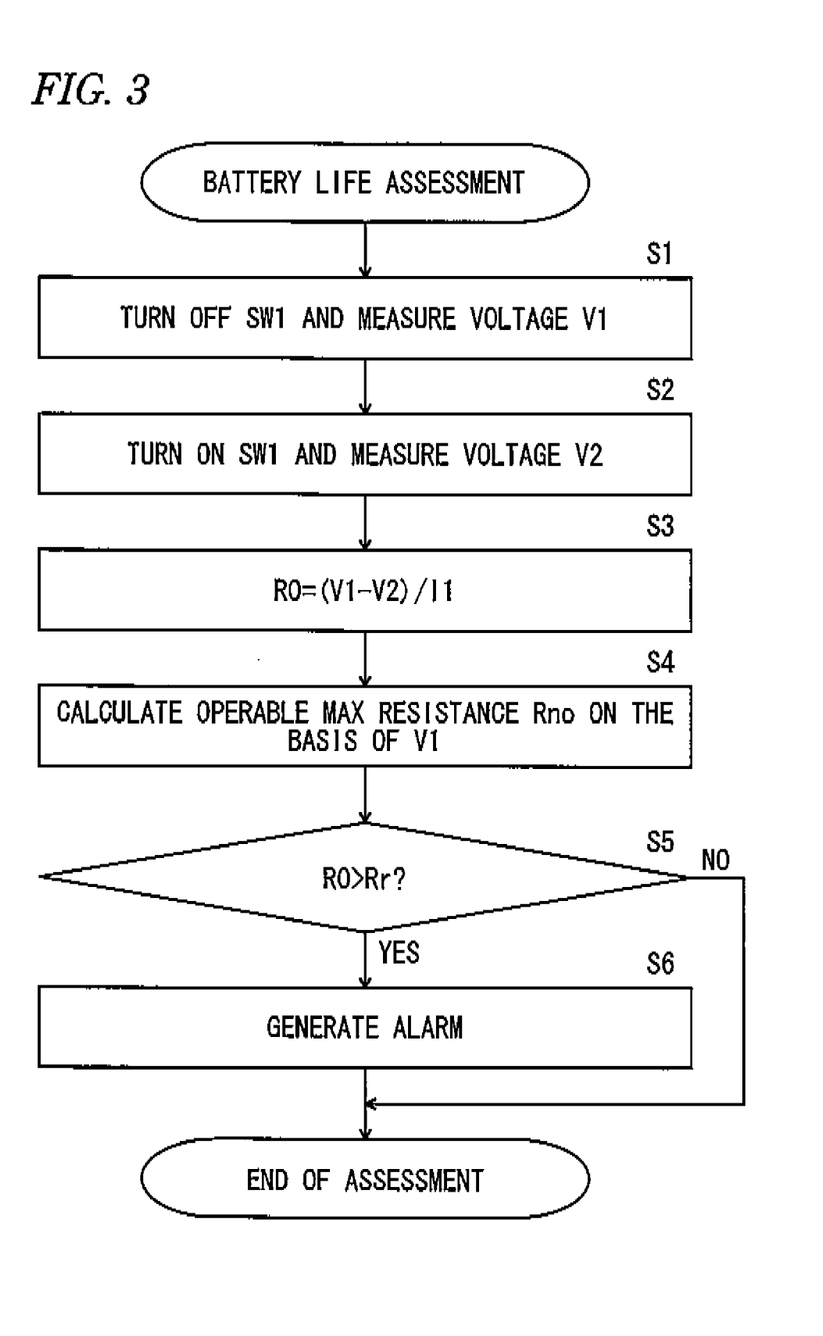
FIG. 3 is a flowchart showing the flow of a process for assessing the life of a battery 1 on the basis of the output voltage in circuits shown in FIGS. 1 and 2.

FIG. 3 is a flowchart showing the flow of a process for assessing the life of the battery 1 on the basis of the output voltage in the circuits shown in FIGS. 1 and 2. The switch SW1 is turned off and the output voltage (open circuit voltage) V1 of the primary battery 1 is measured by the voltage measurement section 2 (at step S1), and the output voltage is stored in a voltage measurement value memory 6e.

Then, the switch SW1 is turned on and the output voltage V2 of the primary battery 1 is measured by the voltage measurement section 2 (at step S2), and the output voltage is stored in the voltage measurement value memory 6e.

On the basis of these output voltages V1 and V2 and the load current I1, the resistance value calculator 6k calculates the internal resistance R0 of the battery 1 using the following expression (at step S3) and stores the resistance value of the calculated internal resistance R0 in the resistance value memory 6m sequentially.

$$R0=(V1-V2)/I1$$

On the basis of the output voltage V1, the minimum drive voltage (for example, 3 V) required for the normal operation of the device and the load current I1, the resistance value calculator 6n calculates the internal resistance Rno of the battery 1 using the following expression (at step S4) and stores the resistance value of the calculated internal resistance Rno in the resistance reference value memory 6p sequentially.

$$Rno=(V1-3)/I1$$

The resistance comparator 6q compares the internal resistance R0 read from the resistance value memory 6m with the internal resistance Rno read from the resistance reference value memory 6p (at step S5).

In the case that the internal resistance R0 is larger than the internal resistance Rno (R0>Rno), it can be judged that the output voltage of the battery has lowered to 3 V or less, and the resistance comparator 6q instructs the alarm output module 6r to output a predetermined alarm, and the alarm output module 6r outputs the predetermined alarm (at step S6).

On the other hand, in the case that R0>Rno is not established, it can be judged that a sufficient output voltage higher than the minimum drive voltage required for the normal operation of the device is obtained. Hence, no alarm is output and the life assessment process is ended.

In the case that a minimum drive voltage of 3 V or more is required for the normal operation of the device at the input terminal of the device, if the output voltage of the battery lowers to 3 V or less, the device cannot operate normally. If the internal resistance of the battery becomes larger, the voltage of the battery at the input terminal of the device becomes lower than the minimum drive voltage due to the consumption current of the device, whereby this kind of phenomenon is likely to occur.

When it is assumed that the internal resistance of the battery capable of securely delivering 3 V at the input terminal of the device is Rno, the internal resistance Rno can be calculated using the simple expression described above, that is, $$Rno = (V1-3)/I1$$

provided that the operation of the device is relatively simple.

For example, in a wireless communication device in which its consumption current changes in a pulse form and a DC-DC converter is further used in its input stage, the input current of the device changes nonlinearly in some cases. In FIG. 1, the output voltage V1 of the battery 1 at the time when the switch SW1 is turned off is the output voltage of the battery 1 delivered when a load current IL flows and includes the voltage drop due to the internal resistance R0 and the load current IL. In other words, as the load current IL is larger, the output voltage V1 becomes lower.

In the case that a DC-DC converter is provided in the input stage of the load circuit ZL, the current gain of the DC-DC converter becomes lower when the output voltage V1 lowers, and the load current IL tends to become larger. As a result, the output voltage V1 further lowers clue to the internal resistance of the battery, whereby the load current IL further increases. With this loop, the output voltage V1 becomes lower and lower.

This kind of loop causes no problem because there are conditions in which stable operation is possible due to the fact that the operation time of wireless communication is limited in reality. However, if the internal resistance R0 increases, for example, at the end of the life of the battery, the output voltage V1 abruptly becomes less than the minimum drive voltage, for example 3 V, in some cases because of the loop.

As a countermeasure for this situation, a correspondence table of the output voltage V1 and the internal resistance Rno on the basis of a simulation performed in consideration of the wireless communication of the device may be provided, for example, in a memory (not shown) of the battery monitor. When the resistance value calculator 6n receives the output voltage V1, the resistance value calculator 6n may load the corresponding internal resistance Rno into the resistance reference value memory 6p by referring to this table. This table may be provided in components other than the battery monitor in the device.

The change in the internal resistance R0 of the battery 1 can be examined in the case that the time during which the switch SW1 is ON at step S2 in the flowchart shown in FIG. 3 is extended.

In the case that a thionyl chloride lithium ion battery is used as the primary battery 1 as in the case of this embodiment, a large thick film having a large resistance grows inside the battery at high temperatures in some cases. This internal film can be removed by applying a current for a certain time or more. Hence, through the adjustment of the time during which the switch SW1 is ON, it is possible to select a target to be measured, that is, an internal resistance determined after finding which factor of the battery 1 causes the internal resistance.

Figure 4:
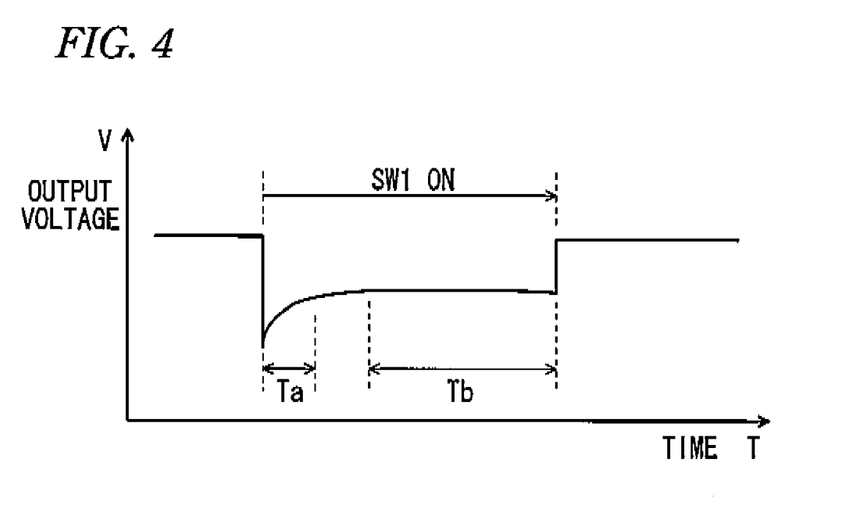
FIG. 4 is a characteristic diagram showing an example of the relationship between the ON time of a switch SW1 and the change of resistance value of an internal resistance R0.

FIG. 4 is a characteristic diagram showing an example of the relationship between the ON time of the switch SW1 and the output voltage V (V1, V2) of the battery 1. The internal resistance R0 of the battery 1 gradually lowers in some cases when a certain level of load current flows. In the case that the output voltage (open circuit voltage) V1 is measured immediately before the turning ON of the switch SW1 and that the output voltage V2 is measured immediately after the turning ON of the switch SW1, the measured internal resistance R0 has a resistance value obtained in which the resistance of the film is dominant.

When the output voltage V2 is measured after the switch SW1 was kept on for a long time and the internal resistance R0 is measured based on the output voltage V2, the film is removed, and a measurement value is obtained in which the reaction resistance due to electrolyte or the like is dominant.

In the case that the resistance of the film is large, the internal resistance R0 of the battery 1 is high immediately after the turning ON of the switch SW1. Then after a while, the film is removed, and only the reaction resistance remains.

Furthermore, in the case that the operation of the device is intermittent, it is assumed that the resistance of the film affects the operation of the device. Moreover, even if the operation of the device is intermittent, in the case that a single operation takes a long time, it is assumed that the operation is not affected by the film resistance.

Figure 5:
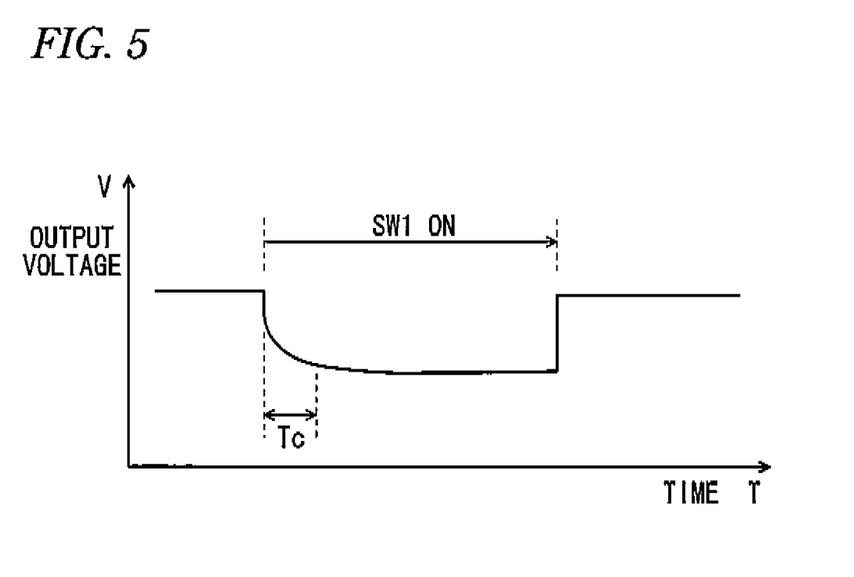
FIG. 5 is a characteristic diagram showing another example of the relationship between the ON time of the switch SW1 and the change of the resistance value of the internal resistance R0.

FIG. 5 is a characteristic diagram showing another example of the relationship between the ON time of the switch SW1 and the output voltage V (V1, V2) of the battery 1. Still further, as shown in FIG. 5, depending on the state of the battery 1, a characteristic is sometimes observed in which the internal resistance R0 of the battery 1 is low immediately after the turning ON of the switch SW1 and then the internal resistance R0 increases gradually. In this case, the drop of the output voltage V2 immediately after the turning ON of the switch SW1 is small, and then the output voltage V2 lowers gradually with time.

In both the cases, the internal resistance R0 that may affect the operation of the device can be assessed by adjusting the ON time of the switch SW1 depending on the operation of the device and by measuring the value of the output voltage V2 of the battery 1 at an optimal timing.

As described above, the present invention can realize a battery monitoring apparatus that generates a battery life alarm accurately in an operable state of a device.

What is claimed is:

1. A battery monitoring apparatus to be built in a device in which a primary battery is used as a driving power source, comprising:

a voltage measuring module configured to obtain an open circuit voltage of the primary battery and an output voltage of the primary battery at the time when a load current flows;

a current measuring module configured to obtain the load current of the primary battery;

a first resistance value calculating module configured to obtain a first internal resistance of the primary battery on the basis of the open circuit voltage, the load current and the output voltage;

a second resistance value calculating module configured to obtain a second internal resistance of the primary battery at which the device can operate normally on the basis of the open circuit voltage, the load current and a minimum drive voltage inherent in the device; and an alarm outputting module configured to output a battery life alarm when the first internal resistance is larger than the second internal resistance, wherein the second resistance value calculating module obtains the corresponding second internal resistance based on the open circuit voltage, by referring to a correspondence table of the open circuit voltage of the primary battery and the second internal resistance of the primary battery on the basis of a simulation performed in consideration of wireless communication of the device.

2. The battery monitoring apparatus according to claim 1, wherein the device is a wireless field device of a process control system.

3. The battery monitoring apparatus according to claim 1, wherein the first internal resistance is obtained by the following equation:

$$R0 = (V1 - V2)/I1,$$

wherein V1 is the open circuit voltage, I1 is the load current, V2 is the output voltage and R0 is the first internal resistance.

4. The battery monitoring apparatus according to claim 1, wherein the second internal resistance is obtained by the following equation:

$$Rno = (V1 - Vmin)/I1$$

wherein V1 is the open circuit voltage, I1 is the load current, Vmin is the minimum drive voltage and Rno is the second internal resistance.

5. The battery monitoring apparatus according to claim 1, wherein the load current is calculated on the basis of the output voltage and a value of a resistor through which the load current flows.

6. A wireless field device of a process control system, comprising:
- a primary battery as a driving power source; and
- the battery monitoring apparatus according to claim 1, configured to monitor the primary battery.

* * * * *